United States Patent [19]

Saito

[11] Patent Number: 5,406,118

[45] Date of Patent: Apr. 11, 1995

[54] SEMICONDUCTOR INTEGRATED CIRCUIT HAVING A LONG BUS LINE

[75] Inventor: Yasuyuki Saito, Yokohama, Japan

[73] Assignee: Kabushiki Kaisha Toshiba, Kawasaki, Japan

[21] Appl. No.: 962,337

[22] Filed: Oct. 16, 1992

[30] Foreign Application Priority Data

Oct. 18, 1991 [JP] Japan .................................. 3-271311

[51] Int. Cl.$^6$ ........................ H01L 23/50; H01L 3/08; H01P 1/24
[52] U.S. Cl. ................................ 257/664; 333/22 R; 257/758; 326/30
[58] Field of Search ....................... 257/259, 664, 758; 333/22 R; 307/443

[56] References Cited

U.S. PATENT DOCUMENTS

| | | | |
|---|---|---|---|
| 4,626,889 | 12/1986 | Yamamoto et al. | 257/664 |
| 4,661,831 | 4/1987 | Schmitt-Landsiedel et al. | 257/393 |
| 5,086,271 | 2/1992 | Haill et al. | 333/22 R |
| 5,208,562 | 5/1993 | Schirm, IV | 333/22 R |

FOREIGN PATENT DOCUMENTS 1-169946  7/1989  Japan .

OTHER PUBLICATIONS

Hamilton & Howard, Basic Integrated Circuit Engineering (McGraw-Hill, NY, 1970) pp. 96-97.

Saito et al., "Drain Current DLTS Spectra and GaAs Substrate Crystal Effect on Low-Frequency-Oscillations of Si-Implanted MESFETs", Mat. Res. Soc. Symp. Proc. vol. 262, pp. 791-795 (1992).

Saito, "Carrier Profile Variation of a Channel Conductive Layer Through Phospho-Silicate-Glass Cap Annealing of N+Si-Implanted GaAs Crystals", Mat. Res. Soc. Symp. Proc. vol. 262, pp. 719-723 (1992).

Saito, "Observation of Ring OSC Wave Forms with Same Area CMOS and BiCMOS Inverters Together with hfe Degradation", Extended Abstracts (The 51st Autumn Meeting, 1990), The Japan Society of Applied Physics, 27p-G-13.

Rao et al., "In$_{0.53}$Ga$_{0.47}$As Metal–Semiconductor–Metal Photodetector Using Proton Bombarded P-type Material", J. Appl. Phys., 70(7), 1 Oct. 1991, pp. 3943–3945.

Saito, "GaAs Phase Effect on Interfacial Drain Current of a 400-um-wide Gate Si-implanted MESFET", J. Appl. Phys., 68(2), 15 Jul. 1990, pp. 830–839.

Saito, "Implanted Si Atoms Shifting Between Ga Sites an As Sites by Thermal Stress in Conductive-Layer GaAs Crystals on Semi-Insulating Substrates", J. Appl. Phys. 71(7), 1 Apr. 1992, p. 3544.

Saito et al., "Drain Current DLTS Spectra and GaAs Substrate Crystal Effect on Low-Frequency-Oscillations of Si-Implanted MESFETs", Abstract E9.8, 1992 U.S.A. Material Research Society Spring Meeting.

Japan Texas Instrument Products Information Report SCJ1521 (May 1, 1991).

Primary Examiner—William D. Larkins
Attorney, Agent, or Firm—Banner, Birch, McKie & Beckett

[57]  ABSTRACT

A semiconductor chip includes a long bus line for transmitting digital signals. The semiconductor chip includes transmission lines for transmitting signals between the bus line and other lines. An impedance regulating element having an impedance, which matches the characteristic impedance of the bus line, is connected to each of the transmission lines.

11 Claims, 7 Drawing Sheets

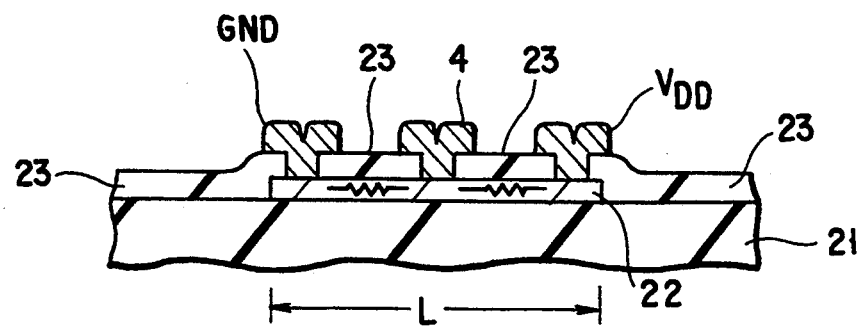
F I G. 2
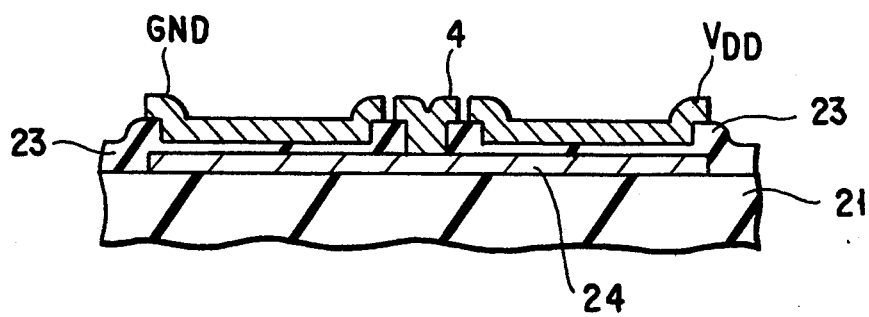
F I G. 3
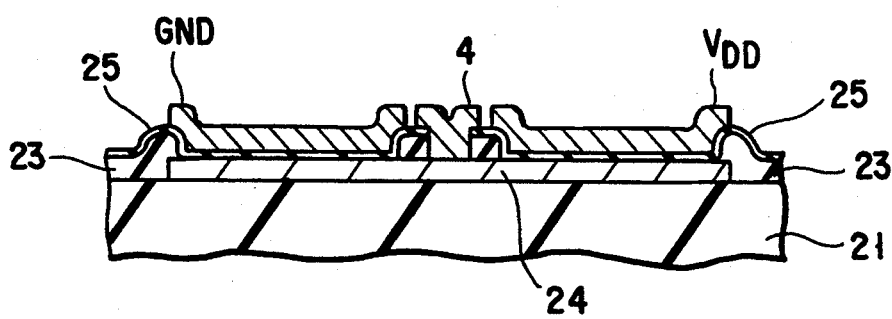
F I G. 4

SEMICONDUCTOR INTEGRATED CIRCUIT HAVING A LONG BUS LINE

BACKGROUND OF THE INVENTION

1. Field of the Invention

This invention relates to a semiconductor integrated circuit for mainly performing logic operations, said circuit having a long transmission line of an internal basic bus circuit and an input circuit of an inverter circuit connected thereto.

2. Description of the Related Art

Sophisticated techniques for processing an integrated circuit having a silicon substrate have been greatly progressing various circuit structures, in which a chip includes a plurality of circuit blocks, each operating independently, have been developed. For example, an LSI chip includes, in general, a 16-bit CPU block of a CISC (complex instruction system chip), a RAM block, a ROM block, a controller block, and the like. These blocks are connected to one another by a large-scale bus line to form a system on the chip.

The above-mentioned integration of a circuit is mainly achieved by miniaturization of a MOS transistor element. The miniaturization of a MOS transistor element increases the cut-off frequency of the MOS transistor. As a result, the response of a MOS transistor with respect to the transient characteristic is naturally increased. Thus, each circuit block can operate at a high speed in accordance with the miniaturization of the elements. However, the entire system of the LSI chip cannot operate at such a high speed, in spite of the miniaturization of the elements.

The slowdown of the operation speed of the entire system of an LSI chip depends on not only the architecture of the system but also the large-scale bus line circuit formed in the LSI chip. The large-scale bus line circuit has a long bus line functioning as a transmission path for transmitting signals between circuit blocks, which are miniaturized and operate at high speed. The operation delay time increases because of the long bus line.

The operation delay time owing to the large-scale bus line circuit is mainly caused by impedance mismatching between the long bus line in the bus line circuit and a high impedance input circuit constituted by a MOS transistor connected to an end of the bus line.

The impedance mismatching causes ringing in the transient characteristic of an electric signal wave form, resulting in a malfunction of the integrated circuit. This problem becomes more serious as the operation speed of the integrated circuit increases more and more.

To prevent the above-mentioned malfunction due to ringing, a slew rate buffer or a Schmitt trigger circuit in the input circuit can be used. However, these means increase the operation delay in accordance with the increase in number of circuit elements, and decrease the integration density.

Otherwise, a Bi-CMOS inverter circuit may be used in a buffer driver for driving the large-scale bus line circuit in order to increase the operation speed of the bus line circuit. Although the buffer driver can drive the bus line circuit at a high speed by means of the Bi-CMOS inverter circuit, the problem of the impedance mismatching cannot be overcome. Even if a CMOS circuit, in place of a Bi-CMOS circuit, is used in the buffer driver, the result will be the same, i.e., the problem of the impedance mismatching cannot be overcome.

In contrast, an ECL (emitter coupled logic) circuit can overcome the mismatching between the characteristic impedance of the transmission line and the input impedance of an active device in a high-speed operation of the bus line circuit. However, the ECL circuit has the following drawbacks: first, it is difficult to connect an ECL circuit to a CMOS logic circuit formed in a large-scale bus line circuit in view of the TTL (transistor transistor logic) level and the amplitude in the CMOS; and secondly, if all of the bus line circuit is formed of ECL circuits, the power consumption may be enormous and the integration of the circuit may be difficult.

In consideration of the above problems, it is necessary and advisable in practice to use a CMOS logic circuit for driving the bus line circuit to achieve a high-speed operation of an LSI, and also to solve a problem of a reflected wave such as ringing caused by the difference in impedance between the long bus line and an end of the transmission line of the basic bus line circuit.

SUMMARY OF THE INVENTION

An object of the present invention is to provide a semiconductor integrated circuit which can operate at a high speed and in which the problem of a reflected wave due to impedance mismatching is overcome, while low power consumption and high integration are achieved.

The object can be achieved by a semiconductor integrated circuit for mainly performing a logic operation, comprising:
 a bus line, formed in the semiconductor integrated circuit, for transmitting digital signals;
 a plurality of transmission lines connecting said bus line and the other routes; and
 buffer devices, formed at connection nodes between said bus line and said plurality of transmission lines, for preventing a reflected wave of a signal transmitted from said bus line to the other routes from deriving.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a cross-sectional view of a first structure of the main part of the present invention;

FIG. 3 is a cross-sectional view of a second structure of the main part of the present invention;

FIG. 4 is a cross-sectional view of a third structure of the main part of the present invention;

DETAILED DESCRIPTION OF THE PREFERRED EMBODIMENTS

Embodiments of the present invention will now be described with reference to the accompanying drawings.

The object of the present invention is not to merely operate a bus line circuit having a long bus line at a high speed. More specifically, the present invention improves the capacity of a driver by decreasing the gate length and increasing the gate width of a transistor constituting the driver (i.e., inverter). In addition, the integrated circuit is designed such that the threshold voltage ($V_{th}$) of the entire circuit is approximately 0 V, and a circuit with an element having a resistance for regulating an input/output impedance is connected between a power source line and a grounded line at either end of the long bus line.

Figure 1:
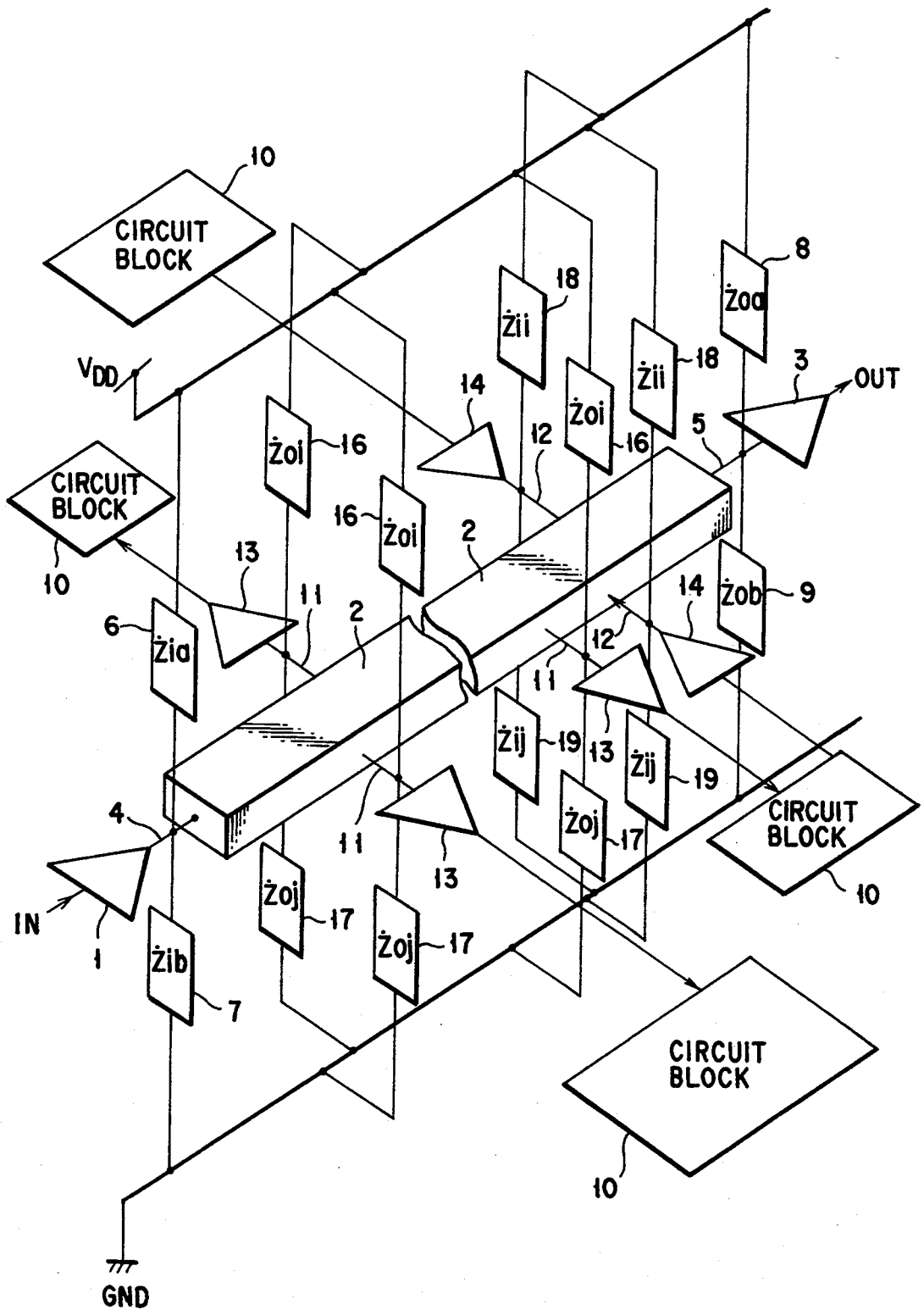
FIG. 1 is a circuit diagram showing main part of the semiconductor integrated circuit according to an embodiment of the present invention.

FIG. 1 shows main part of a semiconductor integrated circuit according to an embodiment of the present invention, i.e., a large-scale bus line circuit for connecting a plurality of circuit blocks operating independently, which are formed in one IC chip.

One end of a bus line 2 is connected to an output terminal of a buffer 1 to which a digital input signal IN is applied, and the other end of the bus line 2 is connected to an input terminal of a buffer 3. Impedance regulating elements for regulating input/output impedance are connected to transmission lines 4 and 5 at the ends of the bus line 2, which are respectively connected to the buffers 1 and 3. More specifically, at one end of the bus line 2, an impedance regulating element 6 having an impedance component $Z_{ia}$ is connected between a power source line $V_{DD}$ and the transmission line 4, and an impedance regulating element 7 having an impedance component $z_{ib}$ is connected between a grounded line GND and the transmission line 4. At the other end of the bus line 2, an impedance regulating element 8 having an impedance component $Z_{oa}$ is connected between the power source line $V_{DD}$ and the transmission line 5, and an impedance regulating element 9 having an impedance component $z_{ob}$ is connected between the grounded line GND and the transmission line 5.

The bus line 2 is connected at given points to transmission lines 11 for transmitting signals from the bus line 2 to circuit blocks 10 performing various functions in the chip, and transmission lines 12 for transmitting signals from circuit blocks 10 to the bus line 2. The transmission lines 11 are connected to input terminals of buffers 13 for transmitting signals from the bus line 2 to the circuit blocks 10. The transmission lines 12 are connected to output terminals of buffers 14 for transmitting signals from the circuit blocks 10 to the bus line 2.

An impedance regulating element 16 having an impedance component $Z_{oi}$ is inserted between each transmission line 11 and the power source line $V_{DD}$. An impedance regulating element 17 having an impedance component $Z_{oj}$ is inserted between each transmission line 11 and the grounded line GND.

An impedance regulating element 18 having an impedance component $Z_{ii}$ is inserted between each transmission line 12 and the power source line $V_{DD}$. An impedance regulating element 19 having an impedance component $Z_{ij}$ is inserted between each transmission line 11 and the grounded line GND.

The impedance regulating elements 6 to 9 and 16 to 19, having desired resistance values, are formed on an insulating film for isolating a conductive layer doped with an impurity from a wiring layer on a semiconductor substrate (not shown). For example, a patterned polycrystalline silicon film doped with P (phosphorous) is used as an impedance element. The resistance value R of an impedance element is set as follows:

$$R = \rho s \times L/W \qquad (1)$$

In the above equation, $\rho s$ denotes the sheet resistivity determined by the concentration of an electrically active impurity doped into the semiconductor substrate (i.e., the concentration of P in this embodiment); L, the length of the resistor element; and w, the width thereof.

The power source line $V_{DD}$ and the grounded line GND, to which the impedance regulating elements 6 to 9 and 16 to 19 are connected, are made of, for example, aluminum.

The resistance R of each of the impedance regulating elements 6 to 9 and 16 to 19 may be set to 50 Ω, which is normally used in an ECL circuit. In this case, an input/output interface circuit (not shown) of a circuit block 10 should be improved in logic amplitude and level, unless the current flowing through a signal line of the bus line 2 is taken into account. In addition, a considerable large current is required in a 50 Ω system. Hence, it is desirable that the resistance R be determined in consideration of the practical conditions such as specifications (e.g., 100 to several k Ω).

Structures of impedance regulating elements 6 to 9 and 16 to 19 will now be described.

FIGS. 2 to 4 are cross-sectional views showing structures of an impedance element in a case where a transmission line (4, 5, 11 or 12) connected to the bus line 2 shown in FIG. 1 is formed on the wiring layer on which the power source line $V_{DD}$ and the grounded line GND are formed.

FIG. 2 shows an example in which an impedance regulating element is a resistor. A resistor 22 of a high resistance made of, for example, polysilicon is formed on an insulating film 21. An insulating film 23 is formed on the resistor 22. A power source line $V_{DD}$, a grounded line GND and a transmission line 4 formed on the insulating film 23 are connected to the resistor 22 through contact holes. If the resistor 22 is formed of a high-resistance metal, for example, Ni or Cr, the width L can be further reduced, in which case, a more highly integrated circuit can be obtained.

FIG. 3 shows an example in which an impedance regulating element is a capacitor. A resistor 24 of a low resistance having a relatively high conductivity is formed on an insulating film 21. An insulating film 23 is formed on the resistor 24. The portions of the insulating film 23 on which a power source line $V_{DD}$ and a grounded line GND are formed are etched and thinner than the other portions thereof. A transmission line 4 is connected to the resistor 24 through a contact hole. The resistor 24 serves as one of the electrodes of each of the capacitors of the power source line $V_{DD}$ and the grounded line GND.

FIG. 4 is a modification of FIG. 3. In this case, the portions of the insulating film 23 on which a power source line $V_{DD}$ and a grounded line GND are formed are entirely etched, and an insulating film 25 having a high dielectric constant, for example, a silicon nitride film, is formed on the resistor 24.

Although the above description is directed to the transmission line 4, impedance regulating elements can be formed on transmission lines 5, 11, and 12 in the same manner.

Further, an impedance regulating element can be formed of a combination of the above-described capacitor and resistor.

FIGS. 5A to 7B show structures of an impedance regulating element in which a transmission line (4, 5, 11 or 12) connected to the bus line 2 shown in FIG. 1, the power source line $V_{DD}$, and the grounded line GND are multilayered.

Figure 5A:
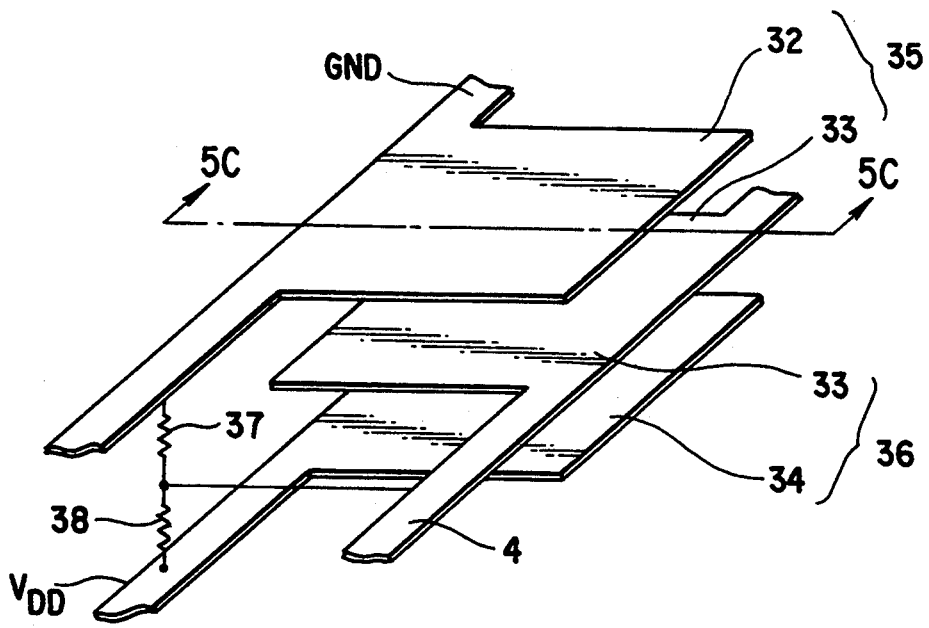
FIG. 5A is a perspective view of a fourth structure of the main part of the present invention.
Figure 5B:
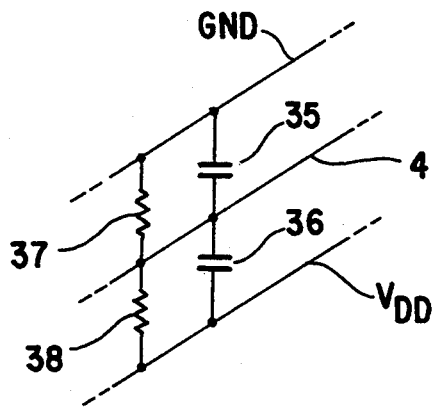
FIG. 5B is an equivalent circuit of the structure shown in FIG. 5A.

FIG. 5A is a perspective view showing an impedance regulating element in which a capacitor and a resistor are combined. A transmission line 4 is formed between a power source line $V_{DD}$ and a grounded line GND. A capacitor electrode 32 of the grounded line GND, a capacitor electrode 33 of the transmission line 4, and a capacitor electrode 34 of the power source line $V_{DD}$ face one another, thereby forming capacitors 35 and 36. A resistor 37 is formed between the transmission line 4 and the grounded line GND. A resistor 38 is formed between the transmission line 4 and the power source line $V_{DD}$. FIG. 5B shows an equivalent circuit of the structure shown in FIG. 5A.

Figure 5C:
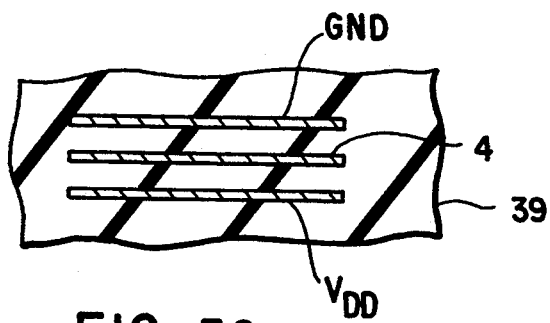
FIG. 5C is a cross-sectional view taken along the line 5C—5C in FIG. 5A.

FIG. 5C is a cross-sectional view of the capacitor portion taken along the line 5C—5C of FIG. 5A. The lines are formed in an insulating film 39 having a predetermined dielectric constant $\epsilon i$. The insulating film is formed of, for example, a silicon oxide film, a BPSG (boron phosphorous silicate glass) film, a PSG film (phosphorous silicate glass), or the like.

Figure 6A:
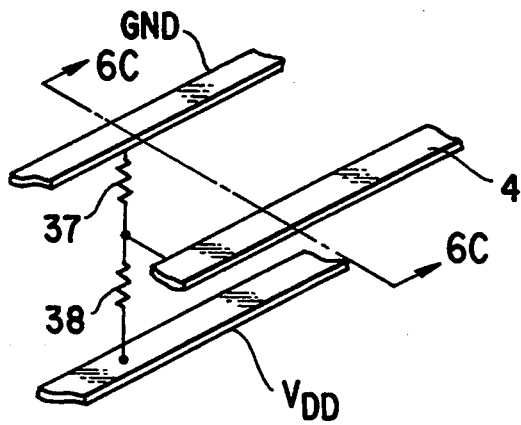
FIG. 6A is a perspective view of a fifth structure of the main part of the present invention.
Figure 6B:
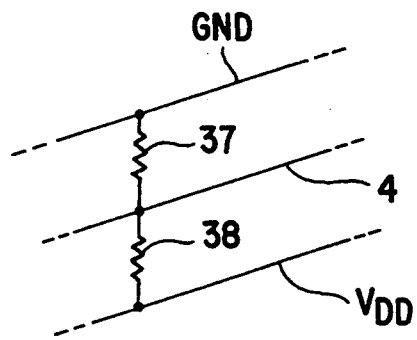
FIG. 6B is an equivalent circuit of the structure shown in FIG. 6A.
Figure 6C:
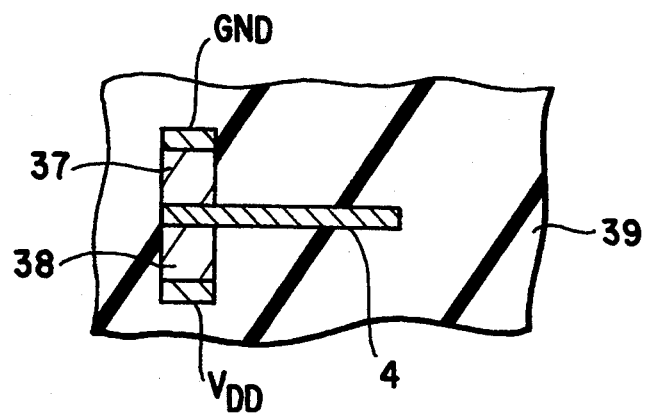
FIG. 6C is a cross-sectional view taken along the line 6C—6C in FIG. 6A.

FIG. 6A is a perspective view showing an impedance regulating element having only a resistor. The structure thereof is similar to the portion of the resistors 37 and 38 shown in FIGS. 5A and 5B. FIG. 6B is an equivalent circuit of the structure shown in FIG. 6A. FIG. 6C is a cross-sectional view of the resistor portion taken along the line 6C—6C of FIG. 6A. The resistor 37 between the transmission line 4 and the grounded line GND and the resistor 38 between the transmission line 4 and the power source line $V_{DD}$ are formed of a high-resistance metal, for example, Ni, Cr, or the like.

Figure 7A:
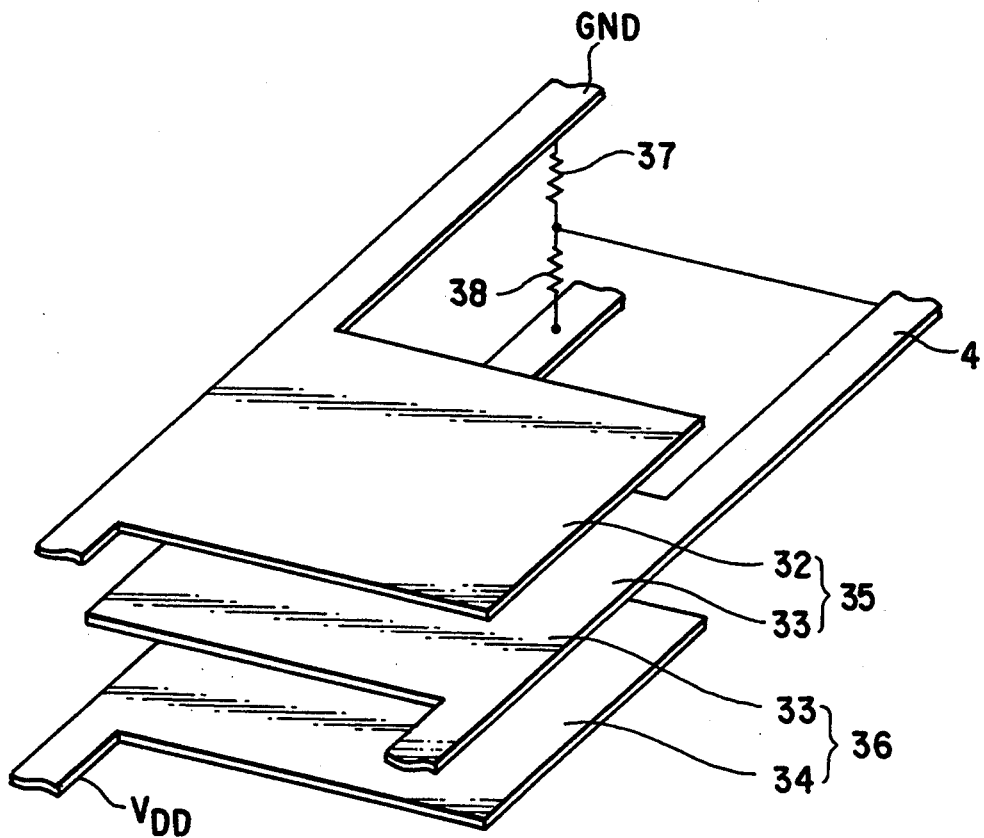
FIG. 7A is a perspective view of a sixth structure of the main part of the present invention.
Figure 7B:
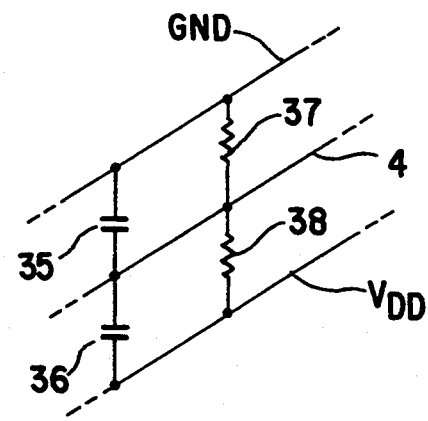
FIG. 7B is a equivalent circuit of the structure shown in FIG. 7A.

FIG. 7A is a perspective view of an impedance element in which the positional relationship between the capacitor and the resistor is reverse to that shown in FIG. 5A. FIG. 7B is an equivalent circuit of the structure shown in FIG. 7A.

Figure 8:
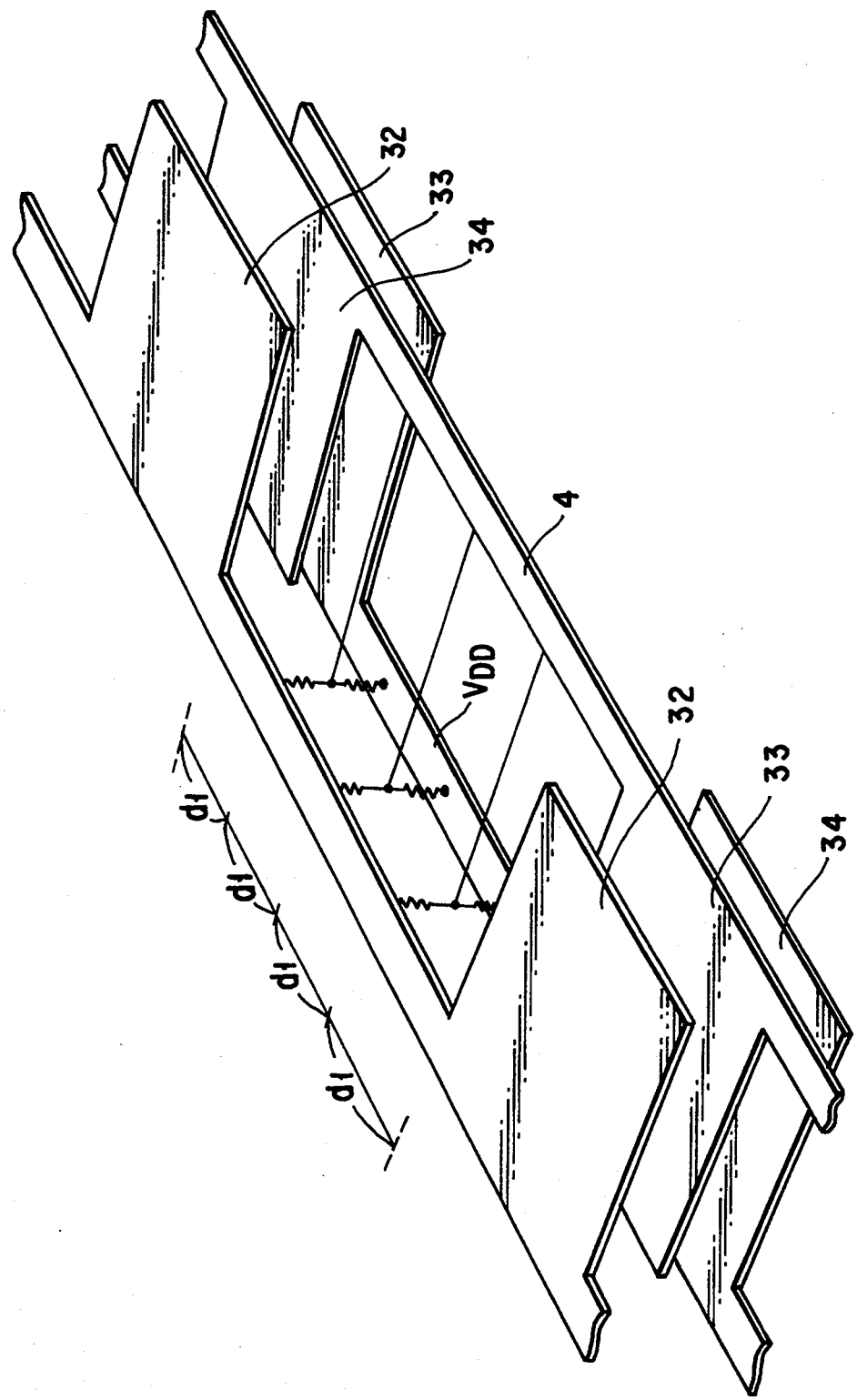
FIG. 8 is a perspective view showing an applied structure, in which the structures of FIGS. 5A, 6A, and 7A are combined.

FIG. 8 is a perspective view showing an application example, in which the impedance elements shown in FIGS. 5A, 6A, and 7A are combined. The impedance elements are arranged at regular intervals d1 (e.g., about 1 mm) in the order of FIGS. 5A, 6A, and 7A, in consideration of impedance symmetry.

Although the above description is made referring to the transmission line 4, impedance elements can be formed on transmission lines 5, 11, and 12 in the same manner.

Another embodiment of the present invention will be described below. In this embodiment, an impedance element is formed of an MOSFET, i.e. a basic element of an integrated circuit.

Figure 9:
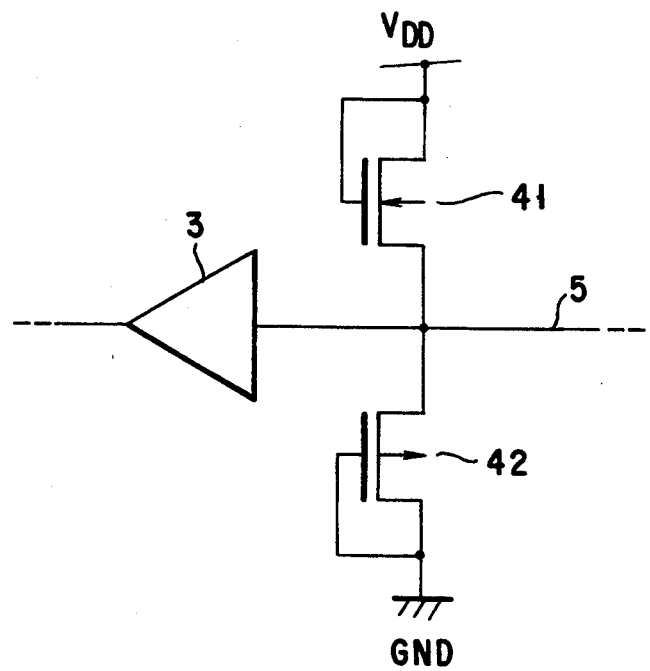
FIG. 9 is a circuit diagram showing another embodiment of the main part of the present invention.

As shown in FIG. 9, MOSFETs 41 and 42 are used as impedance regulating elements. Ions are injected into the MOSFETs 41 and 42 to set a threshold voltage ($V_{th}$), as well as into a MOSFET (not shown) constituting the buffer 3 shown in FIG. 1, for example. Next, ions are injected to the MOSFETs 41 and 42 to form depletion-type (D type) MOSFETs 41 and 42. As a result, impedance regulating elements are formed between a transmission line 5 and a power source line $V_{DD}$, and between the transmission line 5 and a grounded line GND. Otherwise, D type MOSFETs 41 and 42 for regulation can be formed by one ion injection process, independent of the MOSFET serving as the buffer 3. Although the above description is directed to the transmission line 5, impedance elements can be formed on transmission lines 4, 11, and 12 in the same manner.

The resistance of each of the D-type MOSFETs 41 and 42 is determined on the basis of the gate width W and the gate length L thereof. The gate width W and the gate length L can be set in accordance with the saturation drain current Id, which is in proportion to $\mu W(V_{th}-V_g)^2/L$ (where $V_g$ represents a gate voltage and $\mu$ represents mobility of electrons).

In each of the D-type MOSFETs 41 and 42 serving as impedance regulating elements, the gate electrode is electrically connected to the power source line $V_{DD}$ or the grounded line GND to fix the gate voltage at a value.

If the gate electrode of a MOSFET has a polycide structure in which a silicide film is formed on a polysilicon layer, the gate width and the gate length are preset and the resistance R can be controlled by removing the silicide film.

For example, assuming that an integrated circuit is driven by a power source voltage of 5V, when the impedance of the basic bus line is set to a relatively small value (e.g., 50 Ω), the input/output interface of each circuit block 10 in FIG. 1 must be provided with a differential amplifier and the like to regulate the input level. The power source voltage tends to be lowered, in a case where the integration of the circuit is further improved and the gate length of the MOSFET, which is a basic and active element, is decreased, or in a submicron region in the integrated circuit. The present invention is much more effective in these cases, i.e., the circuit for regulating the logic level is simplified or the logic level can be regulated only by changing the threshold voltage $V_{th}$.

The MOSFETs can also be used as capacitors, as well as impedance regulating elements as described above. In this case, the circuit can be designed in consideration of the reactance component of the bus line.

The impedance regulating elements connected to the bus line 2 may be any of resistor elements, MOSFETs, or capacitor elements constituted by a MOSFET. In this case, too, the object of the present invention can be achieved. In addition, the transmission characteristic of the bus line 2 can be regulated by changing the thickness of the insulating film 23 or 25 formed of SiO₂ or SiN₄.

Figure 10:
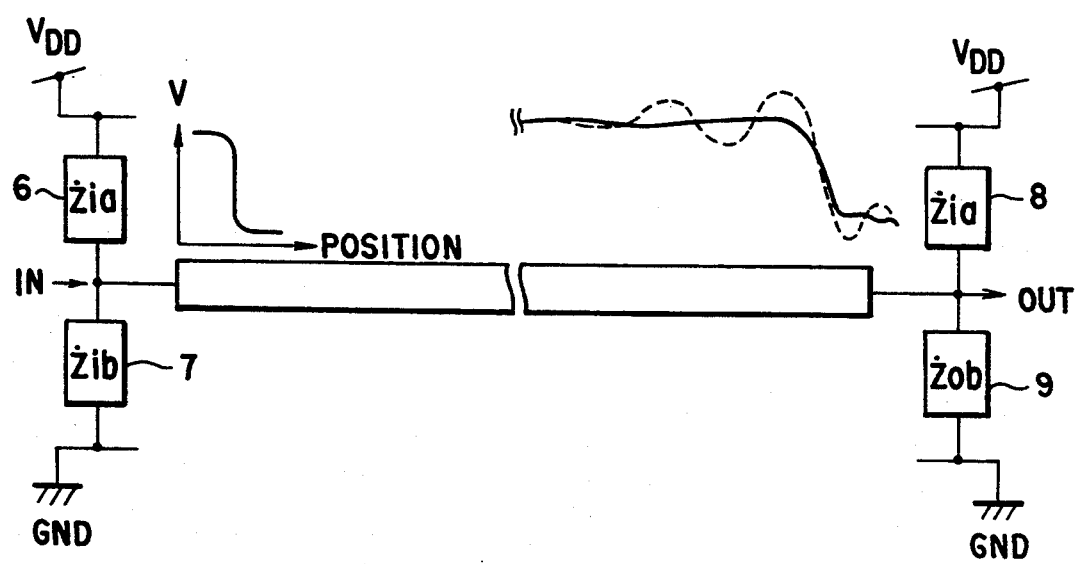
FIG. 10 is a circuit diagram showing an effect of the present invention.

According to the present invention, since the input/output interfaces of the bus line 2 have a regulating function, the reflected wave such as ringing at the end of the bus line in a semiconductor chip is suppressed, unlike in the conventional circuit. That is, the ringing in the circuit of the present invention can be reduced, as indicated by the solid line in FIG. 10, than that in the conventional circuit as indicated by the broken line. As a result, even if the threshold voltage ($V_{th}$) of the entire circuit is set relatively low, malfunction of the circuit can be reduced without using a sophisticated technique and the operation speed (clock or toggle frequency) can be increased.

As has been described above, a semiconductor chip includes input/output impedance regulating elements connected to signal transmission terminals of a long line such as a bus line for transmitting signals to/from the other lines. Accordingly, there is provided a semiconductor integrated circuit which can operate at a high speed and which can overcome the problem of a reflected wave due to impedance mismatching is overcome, while low power consumption and high integration are achieved.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor integrated circuit for performing logic operations, comprising:
    a semiconductor chip;
    a bus line, formed in said semiconductor chip, for transmitting digital signals;
    a plurality of transmission lines for connecting said bus line with other lines; and
    buffer means each connected to a corresponding transmission line, for preventing generation of a reflected wave of a signal transmitted between said bus line and said other lines, each said buffer means comprising first and second impedance regulating elements for regulating an input/output impedance of said bus line, said first impedance regulating element connected between a power source line of said semiconductor chip and the corresponding transmission line and said second impedance regulating element connected between a ground line of said semiconductor chip and the corresponding transmission line, wherein
    said transmission lines include first portions having a first width and second portions having a second width greater than said first width, said power source line includes first portions having a third width and second portions having a fourth width greater than said third width, and said ground line includes first portions having a fifth width and second portions having a sixth width greater than said fifth width, and
    said first impedance regulating elements include capacitors having first electrodes defined by said second portions of said transmission lines and second electrodes defined by said second portions of said power source line and said second impedance regulating elements include capacitors having first electrodes defined by said second portions of said transmission lines and second electrodes defined by said second portions of said ground line.

2. A semiconductor integrated circuit according to claim 1, wherein said first impedance regulating elements further comprise resistor elements connected between said first portions of said transmission lines and said first portions of said power source line, and said second impedance regulating elements further comprise resistor elements formed between said first portions of said transmission lines and said first portions of said ground line.

3. A semiconductor integrated circuit according to claim 1, wherein said first portions of said transmission lines and said second portions of said transmission lines are formed on a single layer.

4. A semiconductor integrated circuit for performing logic operations, comprising:
    a semiconductor chip;
    a bus line, formed in said semiconductor chip, for transmitting digital signals;
    a plurality of transmission lines for connecting said bus line with other lines; and
    buffer means each connected to a corresponding transmission line for preventing generation of a reflected wave of a signal transmitted between said bus line and said other lines, each said buffer means comprising first and second impedance regulating elements for regulating an input/output impedance of said bus line, said first impedance regulating element connected between a power source line of said semiconductor chip and the corresponding transmission line and said second impedance regulating element connected between a ground line of said semiconductor chip and the corresponding transmission line,
    wherein said transmission lines include first portions having a first width and second portions having a second width greater than said first width, said power source line includes first portions having a third width and second portions having a fourth width greater than said third width, and said ground line includes first portions having a fifth width and second portions having a sixth width greater than said fifth width,
    said first impedance regulating elements include capacitors having first electrodes defined by said second portions of said transmission lines and second electrodes defined by said second portions of said power source line and said second impedance regulating elements include capacitors having first electrodes defined by said second portions of said transmission lines and second electrodes defined by said second portions of said ground line, and
    said first impedance elements further include resistor elements connected between said first portions of said transmission lines and said first portions of said power source line, and said second impedance elements further include resistor elements connected between said first portions of said transmission lines and said first portions of said ground line.

5. A semiconductor integrated circuit according to claim 4, wherein said first and second impedance elements match an input/output impedance of said each of said transmission lines with a characteristic impedance of said bus line.

6. A semiconductor integrated circuit, comprising:
a semiconductor chip;
a bus line, formed in said semiconductor chip, for transmitting digital signals;
a plurality of circuit blocks operating independently of one another in said semiconductor chip;
a plurality of transmission lines for coupling said circuit blocks with an intermediate portion of said bus line;
first impedance regulating elements connected between a power source line and each of said transmission lines; and
second impedance regulating elements connected between a ground line and each of said transmission lines,
wherein said transmission lines include first portions having a first width and second portions having a second width greater than said first width, said power source line includes first portions having a third width and second portions having a fourth width greater than said third width, and said ground line includes first portions having a fifth width and second portions having a sixth width greater than said fifth width, and
said first impedance regulating elements include capacitors having first electrodes defined by said second portions of said transmission lines and second electrodes defined by said second portions of said power source line and said second impedance regulating elements include capacitors having first electrodes defined by said second portions of said transmission lines and second electrodes defined by said second portions of said ground line.

7. A semiconductor integrated circuit according to claim 6, wherein said first impedance regulating elements further include resistor elements connected between said first portions of said transmission lines and said first portions of said power source line, and said second impedance regulating elements further include resistor elements connected between said first portions of said transmission lines and said first portions of said ground line.

8. A semiconductor integrated circuit according to claim 6, wherein said first portions of said transmission lines and said second portions of said transmission lines are formed on a single layer.

9. A semiconductor integrated circuit according to claim 6, wherein said first and second impedance elements match an input/output impedance included in said each of transmission lines with a characteristic impedance of said bus line.

10. A semiconductor integrated circuit comprising:
a semiconductor chip;
a bus line, formed in said semiconductor chip, for transmitting digital signals;
a plurality of circuit blocks operating independently of one another in said semiconductor chip;
a plurality of transmission lines for coupling said circuit blocks with an intermediate portion of said bus line;
first impedance regulating elements connected between a power source line and each of said transmission lines; and
second impedance regulating elements connected between a ground line and each of said transmission lines,
wherein said transmission lines include first portions having a first width and second portions having a second width greater than said first width, said power source line includes first portions having a third width and second portions having a fourth width greater than said third width, and said ground line includes first portions having a fifth width and second portions having a sixth width greater than said fifth width, and
said first impedance regulating elements include capacitors having first electrodes defined by said second portions of said transmission lines and second electrodes defined by said second portions of said power source line and said second impedance regulating elements include capacitors having first electrodes defined by said second portions of said transmission lines and second electrodes defined by said second portions of said ground line, and
said first impedance elements further include resistor elements connected between said first portions of said transmission lines and said first portions of said power source line and said second impedance elements further include resistor elements connected between said first portions of said transmission lines and said first portions of said ground line.

11. A semiconductor integrated circuit according to claim 10, wherein said first and second impedance elements match an input/output impedance included in said each of transmission lines with a characteristic impedance of said bus line.

* * * * *